(12) United States Patent
Leidy et al.

(10) Patent No.: US 8,006,211 B2
(45) Date of Patent: *Aug. 23, 2011

(54) IC CHIP AND DESIGN STRUCTURE INCLUDING STITCHED CIRCUITRY REGION BOUNDARY IDENTIFICATION

(75) Inventors: Robert K. Leidy, Burlington, VT (US); Kevin N. Ogg, Burlington, VT (US); Richard J. Rassel, Essex Jct, VT (US); Jeanne-Tania Sucharitaves, Bangkok (TH)

(73) Assignee: International Business Machines Corporation, Armonk, NY (US)

( * ) Notice: Subject to any disclaimer, the term of this patent is extended or adjusted under 35 U.S.C. 154(b) by 670 days.

This patent is subject to a terminal disclaimer.

(21) Appl. No.: 12/112,336

(22) Filed: Apr. 30, 2008

(65) Prior Publication Data

US 2009/0276739 A1 Nov. 5, 2009

(51) Int. Cl.
*G06F 17/50* (2006.01)
(52) U.S. Cl. .......... 716/122; 716/50; 716/124; 716/139
(58) Field of Classification Search .............. 716/50, 716/122, 124, 136, 139
See application file for complete search history.

(56) References Cited

U.S. PATENT DOCUMENTS

| | | | |
|---|---|---|---|
| 5,301,124 A | 4/1994 | Chan et al. |
| 5,837,557 A | 11/1998 | Fulford, Jr. et al. |
| 6,048,785 A | 4/2000 | Fulford, Jr. et al. |
| 6,150,840 A | 11/2000 | Patel et al. |
| 6,194,105 B1 | 2/2001 | Shacham et al. |
| 6,225,013 B1 | 5/2001 | Cohen et al. |
| 6,335,635 B1 | 1/2002 | Patel et al. |
| 6,690,076 B1 | 2/2004 | Fossum et al. |
| 6,782,499 B2 | 8/2004 | Osada et al. |
| 7,093,143 B2 | 8/2006 | Ito et al. |
| 7,117,466 B2 | 10/2006 | Kalafala et al. |
| 7,141,883 B2 | 11/2006 | Wei et al. |
| 7,161,828 B2 | 1/2007 | Cummings et al. |
| 2001/0026172 A1 | 10/2001 | Leenstra et al. |
| 2005/0246116 A1 | 11/2005 | Foreman et al. |

(Continued)

FOREIGN PATENT DOCUMENTS

JP 11176937 2/1999

(Continued)

OTHER PUBLICATIONS

Dunham et al., "Stitched IC Chip Layout Methods, Systems and Program Product," U.S. Appl. No. 11/678,069, filed Feb. 23, 1997, pp. 1-33.

(Continued)

*Primary Examiner* — Sun J Lin
(74) *Attorney, Agent, or Firm* — Anthony J. Canale; Hoffman Warnick LLC (57) ABSTRACT

Stitched circuitry region boundary identification for a stitched IC chip layout is presented along with a related IC chip and design structure. One method includes obtaining a circuit design for an integrated circuit (IC) chip layout that exceeds a size of a photolithography tool field, wherein the IC chip layout includes a stitched circuitry region; and modifying the IC chip layout to include a boundary identification identifying a boundary of the stitched circuitry region at which stitching occurs, wherein the boundary identification takes the form of a negative space in the IC chip layout. One IC chip may include a plurality of stitched circuitry regions; and a boundary identification identifying a boundary between a pair of the stitched circuitry regions, wherein the boundary identification takes the form of a negative space in a layer of the IC chip.

13 Claims, 11 Drawing Sheets

U.S. PATENT DOCUMENTS

2006/0071691 A1      4/2006    Garlepp
2009/0276739 A1      11/2009    Leidy et al.

FOREIGN PATENT DOCUMENTS

JP            2005141434          6/2005

OTHER PUBLICATIONS

Dunham et al., "Stitched IC Chip Layout Methods, Systems and Program Product," PCT/US08/54705, Feb. 22, 2008, 29 pages.
Davis, D.E., "Stitching Technique for Electron Beam Lithography System," IBM Technical Disclosure Bulletin, Oct. 1978, pp. 1875-1876.
Davis, D.E., "Field Stitching Method," IBM Technical Disclosure Bulletin, Jun. 1979, pp. 114-115.
Chen et al., "Static Timing: Back to Our Roots", IBM Research, 7 pages.
Moore, R.D., "Efficient Stitching Method," IBM Technical Disclosure Bulletin, Jan. 1978, vol. 20, No. 8, pp. 3104-3105.
U.S. Appl. No. 11/849,461, Office Action, Aug. 4, 2009, 11 pages.
Lin, Sun J., U.S. Appl. No. 12/112,329, filed Apr. 30, 2008, Office Action dated Aug. 30, 2010, 14 pages.
U.S. Appl. No. 11/678,069, filed Feb. 23, 2007, Response to 312 Amendment filed Dec. 10, 2009, dated Dec. 18, 2009.
U.S. Appl. No. 11/678,069, filed Feb. 23, 2007, 312 Amendment filed Dec. 10, 2009.
U.S. Appl. No. 11/849,461, filed Sep. 4, 2007, Notice of Allowance dated Dec. 8, 2009.
U.S. Appl. No. 11/678,069, filed Feb. 23, 2007, Notice of Allowance dated Dec. 2, 2009.
U.S. Appl. No. 11/678,069, Amendment to Office Action dated Aug. 4, 2009, filed Nov. 4, 2009.
U.S. Appl. No. 11/849,461, filed Sep. 4, 2007, Amendment to Office Action dated Aug. 4, 2009, filed Nov. 4, 2009.
Lin, Sun J., U.S. Appl. No. 12/112,329, Notice of Allowance & Fees Due, Jan. 28, 2011, 8 pages.

IC CHIP AND DESIGN STRUCTURE INCLUDING STITCHED CIRCUITRY REGION BOUNDARY IDENTIFICATION

CROSS-REFERENCE TO RELATED APPLICATIONS

This application is related to U.S. Ser. No. 12/112,329, filed Apr. 30, 2008, allowed as of Jan. 28, 2011.

TECHNICAL FIELD

The disclosure relates generally to integrated circuit (IC) chip fabrication and design, and more particularly, to identifying a stitched circuitry region boundary identification in stitched IC chip layout.

BACKGROUND ART

In the integrated circuit (IC) chip fabrication industry, circuitry is formed in a semiconductor substrate using photolithography. One challenge that the industry faces is that large circuit designs are too large to place as a whole on the reticles used in photolithography. One remedy to this issue is leveraging the redundancy within the IC chip design to break the design up into a subset of smaller unique dissected regions. When resolved in multiple regions, the dissected regions can form the completed large IC chip layout on a wafer by a process commonly referred to as "stitching". Stitching includes placing the dissected IC chip (stitched) regions onto a reticle and performing multiple exposures on the wafer in order to complete the final whole IC chip image.

With the increased use of stitched IC layouts and the improved control of mating stitched circuitry regions, it is becoming difficult to easily locate stitch region boundaries within an IC layout for process control metrology. Current approaches place marking shapes within the kerf of the wafers to mark boundaries.

SUMMARY

Stitched circuitry region boundary identification for a stitched IC chip is presented along with a related IC chip and design structure. One method includes obtaining a circuit design for an integrated circuit (IC) chip layout that exceeds a size of a photolithography tool field, wherein the IC chip layout includes a stitched circuitry region; and modifying the IC chip layout to include a boundary identification identifying a boundary of the stitched circuitry region at which stitching occurs, wherein the boundary identification takes the form of a negative space in the IC chip layout. One IC chip may include a plurality of stitched circuitry regions; and a boundary identification identifying a boundary between a pair of the stitched circuitry regions, wherein the boundary identification takes the form of negative space in a layer of the IC chip.

A first aspect of the disclosure provides a method comprising: obtaining a circuit design for an integrated circuit (IC) chip layout that exceeds a size of a photolithography tool field, wherein the IC chip layout includes a stitched circuitry region; and modifying the IC chip layout to include a boundary identification identifying a boundary of the stitched circuitry region at which stitching occurs, wherein the boundary identification takes the form of a negative space in the IC chip layout.

A second aspect of the disclosure provides a system comprising: an obtainer for obtaining a circuit design for an integrated circuit (IC) chip layout that exceeds a size of a photolithography tool field, wherein the IC chip layout includes a stitched circuitry region; and a modifier for modifying the IC chip layout to include a boundary identification identifying a boundary of the stitched circuitry region at which stitching occurs, wherein the boundary identification takes the form of a negative space in the IC chip layout.

A third aspect of the disclosure provides a program product stored on a computer-readable medium, which when executed, modifies a circuit design, the program product comprising: program code for obtaining a circuit design for an integrated circuit (IC) chip layout that exceeds a size of a photolithography tool field, wherein the IC chip layout includes a stitched circuitry region; and program code for modifying the IC chip layout to include a boundary identification identifying a boundary of the stitched circuitry region at which stitching occurs, wherein the boundary identification takes the form of a negative space in the IC chip layout.

A fourth aspect of the disclosure provides a method comprising: obtaining an image of an IC chip layer formed using a plurality of stitched circuitry regions; and identifying a boundary between stitched circuitry regions by identifying a negative space within the IC chip layer from the image.

A fifth aspect of the disclosure provides an integrated circuit (IC) chip comprising: a plurality of stitched circuitry regions; and a boundary identification identifying a boundary between a pair of the stitched circuitry regions, wherein the boundary identification takes the form of negative space in a layer of the IC chip.

A sixth aspect of the disclosure is directed to a design structure embodied in a machine readable medium for designing, manufacturing, or testing an integrated circuit, the design structure comprising: an integrated circuit (IC) chip comprising: a plurality of stitched circuitry regions; and a boundary identification identifying a boundary between a pair of the stitched circuitry regions, wherein the boundary identification takes the form of negative space in a layer of the IC chip.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

As indicated above, the disclosure provides stitched boundary identification for a stitched IC chip layout, and a related IC chip and design structure. In particular, embodiments are disclosed for providing stitched boundary identification and identifying a stitched boundary in an IC chip. In addition, an IC chip including a boundary identification and a related design structure are presented.

Figure 1:
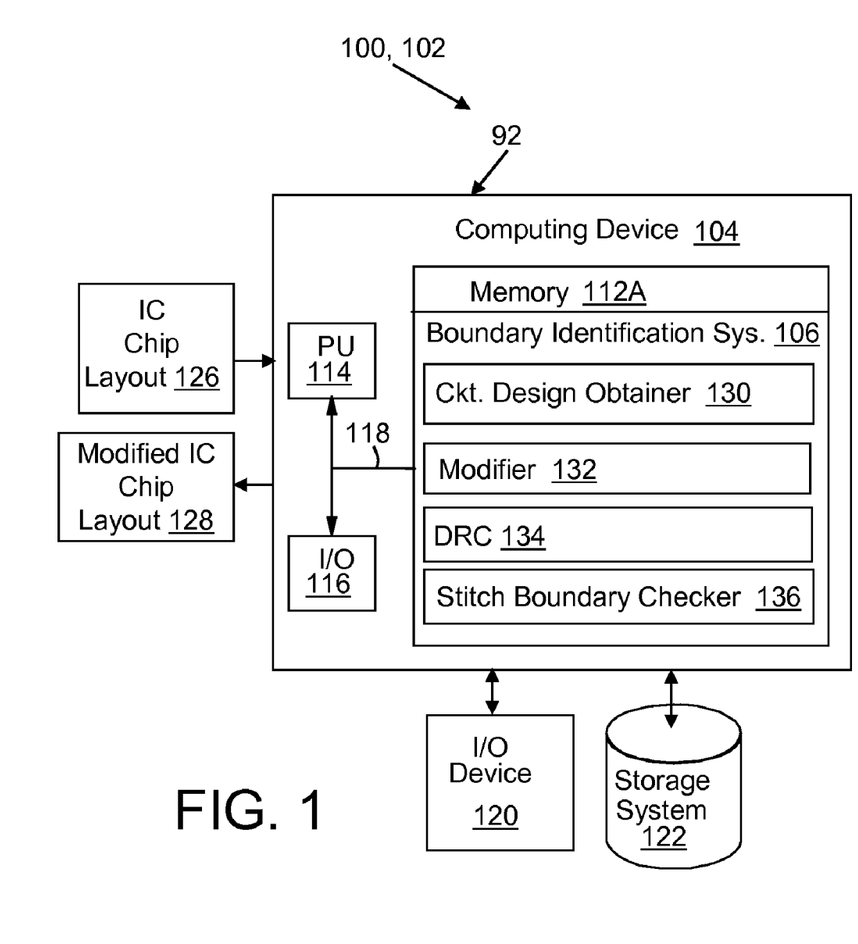
FIG. 1 shows embodiments of a computer infrastructure environment.
Figure 3:
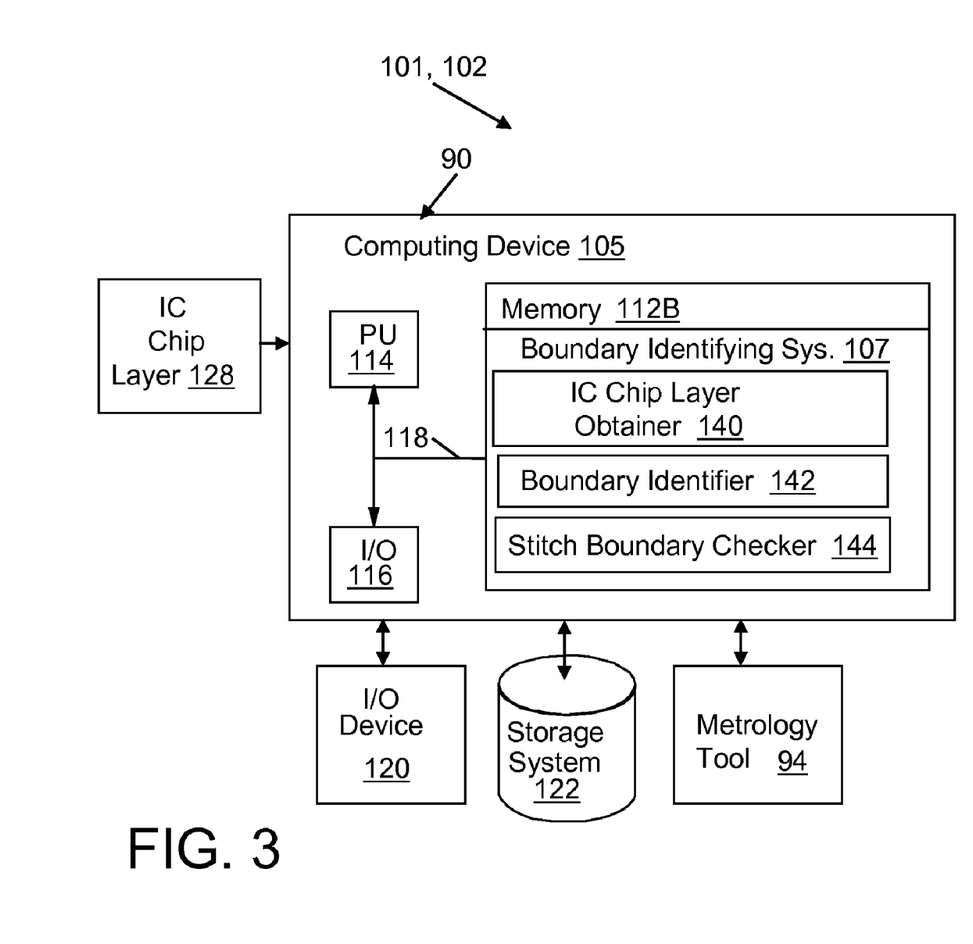
FIG. 3 shows embodiments of a computer infrastructure environment.

Turning to the drawings, FIG. 1 shows an illustrative environment 100 for providing stitched boundary identification, and FIG. 3 shows an illustrative environment 101 for identifying a stitched boundary identification. Environment 100, 101 each include a computer infrastructure 102 that can perform the various process steps described herein. In particular, computer infrastructure 102 is shown including a computing device 104, 105, respectively, that may comprise a boundary identification system (sys.) 106 (FIG. 1), which enables computing device 104 to modify an IC chip layout 126 to include stitched circuitry region boundary identification, or a boundary identifying system (sys.) 107 (FIG. 3) which enables computing device 105 to identify a stitched boundary according to the disclosure. Each computing device 104, 105 is shown including a memory 112A or 112B, a processing unit (PU) 114, an input/output (I/O) interface 116, and a bus 118. Further, computing devices 104, 105 are shown in communication with an external I/O device/resource 120 and a storage system 122. As is known in the art, in general, processor 114 executes computer program code, such as boundary identification system 106, that is stored in memory 112A and/or storage system 122. While executing computer program code, processor 114 can read and/or write data, such as reticle data, to/from memory 112A, storage system 122, and/or I/O interface 116. Bus 118 provides a communications link between each of the components in computing devices 104, 105. I/O device 118 can comprise any device that enables a user to interact with first computing devices 104, 105 or any device that enables computing devices 104, 105 to communicate with one or more other computing devices. Input/output devices (including but not limited to keyboards, displays, pointing devices, etc.) can be coupled to the system either directly or through intervening I/O controllers.

In any event, computing devices 104, 105 can each comprise any general purpose computing article of manufacture capable of executing computer program code installed by a user (e.g., a personal computer, server, handheld device, etc.). However, it is understood that computing devices 104, 105 and related systems 106, 107 are only representative of various possible equivalent computing devices that may perform the various process steps of the disclosure. To this extent, in other embodiments, computing devices 104, 105 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the disclosure. For example, in one embodiment, computer infrastructure 102 comprises two or more computing devices that communicate over any type of wired and/or wireless communications link, such as a network, a shared memory, or the like, to perform the various process steps of the disclosure. For example, computing devices 104 and 105 may communicate with one another. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques. In an alternative embodiment, systems 106, 107 may be provided in a single computing device.

As previously mentioned and discussed further below, boundary identification system 106 (FIG. 1) enables computing infrastructure 102 to modify an IC chip layout 126 to include stitched circuitry region boundary identifier according to the disclosure. To this extent, boundary identification system 106 is shown including a circuit (ckt.) design obtainer 130, a modifier 132, a design rule checker (DRC) 134 and a stitch boundary checker 136. As also previously mentioned and discussed further below, boundary identifying system 107 (FIG. 3) enables computing infrastructure 102 to identify a stitched boundary in a layer of an IC chip. To this extent, boundary identifying system 107 is shown including a IC chip layer obtainer 140, a boundary identifier 142 and a stitch boundary checker 144. Operation of each of the above-stated functions is discussed further herein. However, it is understood that some of the various systems shown in FIGS. 1 and 3 can be implemented independently, combined, and/or stored in memory for one or more separate computing devices that are included in computer infrastructure 102. Further, it is understood that some of the functionality may not be implemented, or additional functionality may be included as part of environment 100, 101.

As discussed herein, various systems and components may be described as "obtaining" (e.g., circuit design obtainer 130, IC chip layer obtainer 140, etc.). It is understood that the corresponding data can be obtained using any solution. For example, the corresponding system/component can generate and/or be used to generate the data, retrieve the data from one or more data stores (e.g., a database), receive the data from another system/component (e.g., circuit design system of a foundry customer system and/or from a foundry customer system), and/or the like. When the data is not generated by the particular system/component, it is understood that another system/component can be implemented apart from the system/component shown, which generates the data and provides it to the system/component and/or stores the data for access by the system/component.

Figure 2:
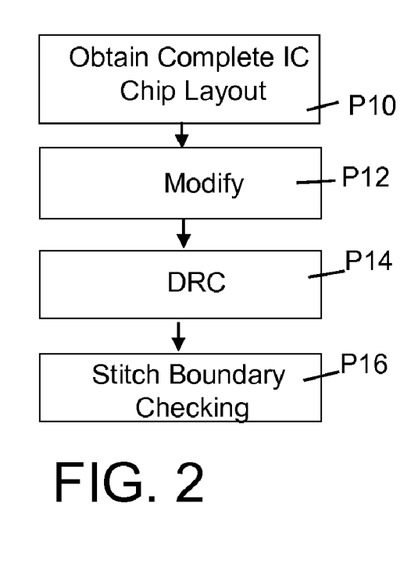
FIG. 2 shows embodiments of a method of modifying an IC chip layout.
Figure 5:
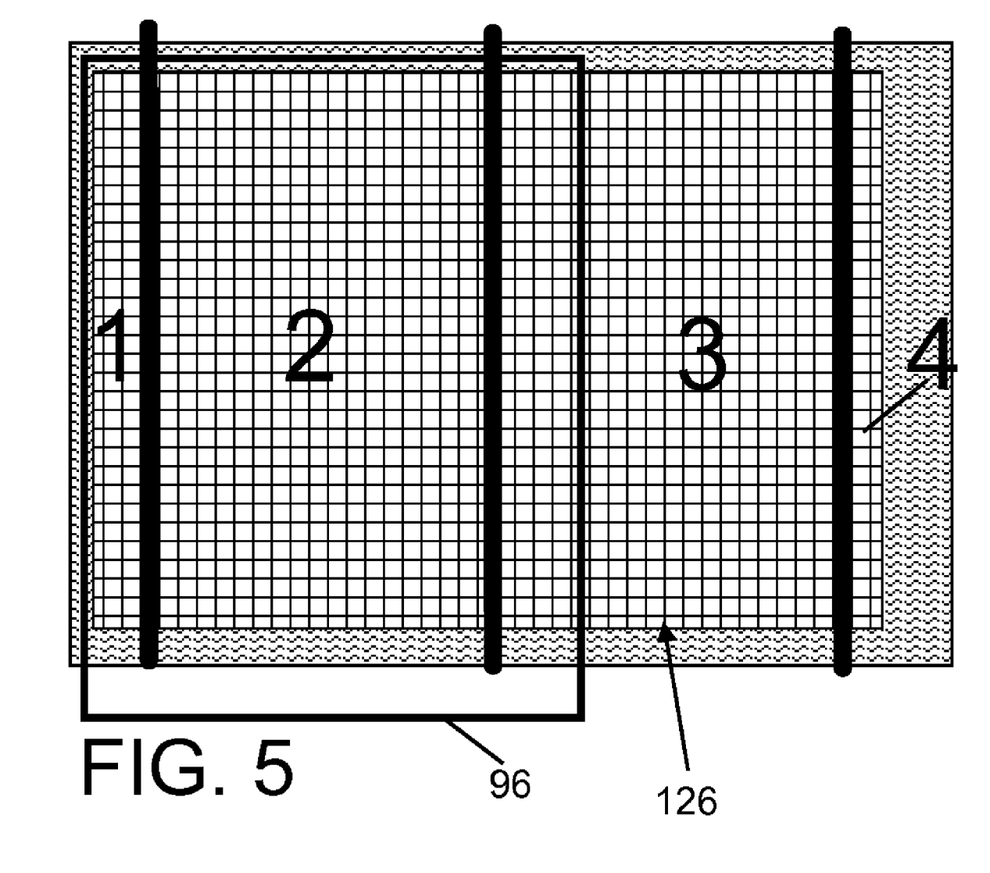
FIG. 5 shows embodiments of an IC chip layout that extends beyond a field of a photolithographic tool.

Turning to FIG. 2 in conjunction with FIG. 1, embodiments of a method of modifying an IC chip layout 126 to include stitched circuitry region boundary identifier will now be described. In process P10, circuit (ckt.) design obtainer 130 obtains a circuit design for an IC chip layout 126 that exceeds a size of a photolithography tool field. As shown in FIG. 5, an IC chip layout 126 may include all circuitry that will eventually be generated from the layout, and therefore, could be generated if photolithography tools having a sufficiently large field existed. However, as shown in FIG. 5, IC chip layout 126 exceeds a size of a field 96 of a photolithography tool (not shown). Hence, IC chip layout 126 cannot be fabricated as is.

Figure 6:
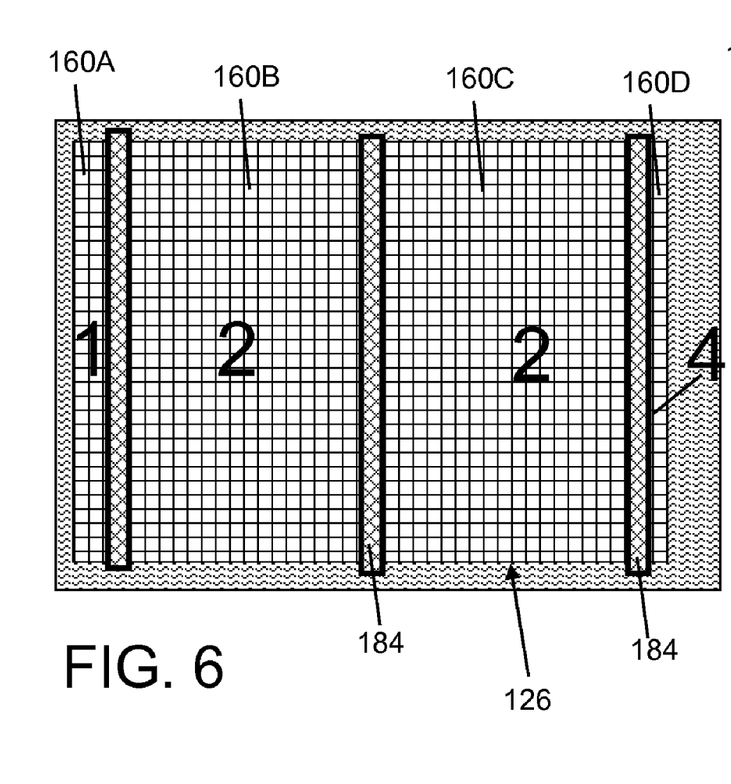
FIG. 6 shows embodiments of redundant portions of the complete IC chip layout of FIG. 5.
Figure 7:
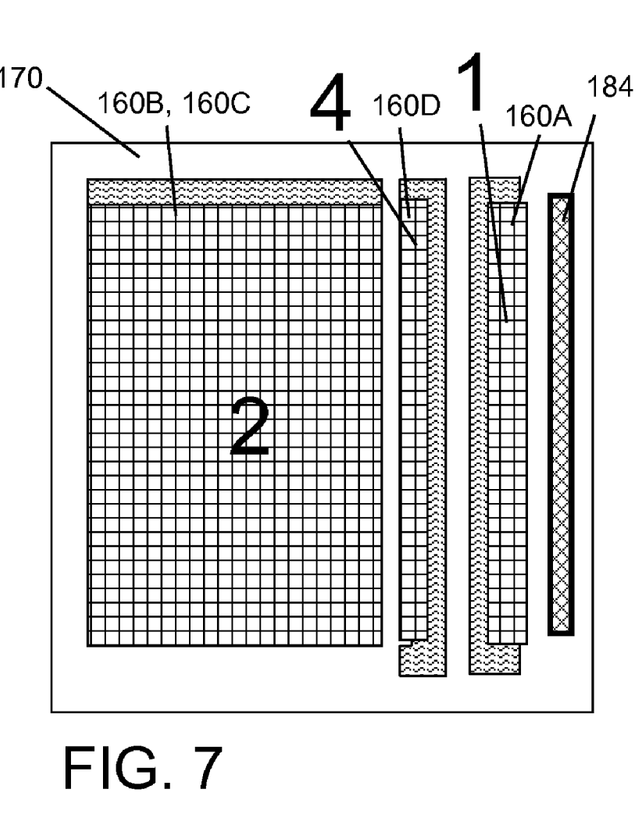
FIG. 7 shows embodiments of a modified IC chip layout on a photolithography reticle.

In this situation, IC chip layout 126 may be segmented into one or more stitched circuitry regions. As used herein, a "stitched circuitry region" or "stitched region" is a portion of an IC chip layout 126 that is segmented from an adjacent part of the IC chip layout on a photolithography reticle, and can be produced using the reticle such that the stitched circuitry region can be stitched together with the adjacent part to attain the relevant part of the original complete IC layout 126. As shown in FIG. 5, a plurality of stitched circuitry regions 1-4 include at least one redundant stitched circuitry region (includes circuitry 2 and 3) and at least one unique stitched circuitry region (circuitry 1 and 4) (a plurality of stitched circuitry regions are shown). Restated, as shown in FIG. 6, regions 160B and 160C are actually identical (both include circuitry 2), and regions 160A, 160D are not identical to any other part and, hence, are unique. As such, as shown in FIG. 7, redundant regions 160B and 160C can be formed once in a photolithographic reticle 170 used to form stitched circuitry regions 160B, 160C. Unique stitched circuitry regions 160A and 160D are also formed individually on reticle 170. In another embodiment, IC chip layout 126 cannot be fabricated as is, but can be broken into multiple stitched circuitry regions and rearranged on reticle 170 to form all necessary regions without any redundant stitched circuitry regions being identified. For example, a long and narrow complete IC chip layout 126 exceeding the size of field 96 (FIG. 5) of a photolithography tool in only one direction and small enough in the other direction to fit the stitched circuitry regions that fall outside of the field of the photolithography tool into the tool field elsewhere, may be rearranged in that manner. As will be described in greater detail herein, an IC chip may be produced using reticle 170 such that the boundaries between circuitries formed using the stitched circuitry regions are oftentimes practically impossible to discern.

Figure 8:
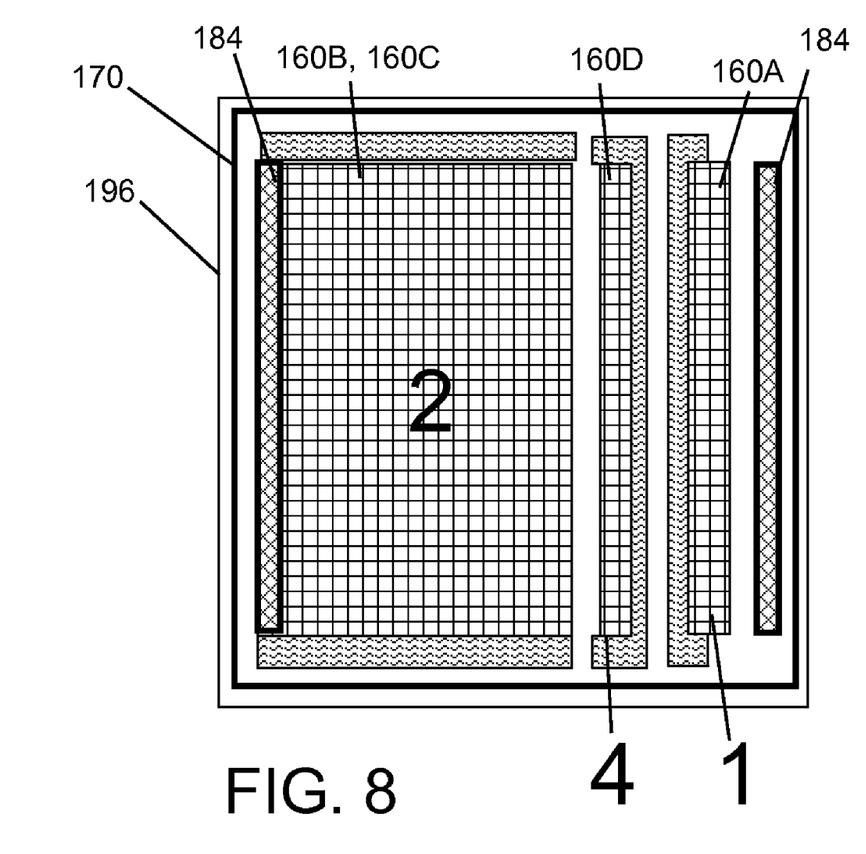
FIG. 8 shows embodiment of the modified IC chip layout of FIG. 7 compared to a field of a photolithography tool.

In an optional embodiment, a stitch boundary region 184 may be employed for stitching at least two stitched circuitry regions (e.g., 160B, 160C) together. Stitch boundary region 184 may be provided as a separate entity (FIGS. 7 and 8) or incorporated into at least one of stitched regions 160B-C (FIG. 8, left side only; typically, stitched boundary region 184 would be provided in only one location.) In the latter case, stitched regions 160A-D would be formed in an overlap fashion such that stitched boundary region 184 would allow for mating structure. It is understood that different adjacent stitched circuitry regions 160A-D may require different structure(s) for stitching together; accordingly, any number of stitched boundary regions 184 may be employed. Stitched circuitry regions 160A-D and/or stitch boundary region 184 may be formed on photolithography reticle 170, which may be used to reproduce the entire IC chip layout 126. As shown in FIG. 8, all of the regions fit within a field 196 of a photolithography tool.

In process P12 (FIG. 2), modifier 132 (FIG. 1) modifies IC chip layout 126 to include a boundary identification 200 (FIGS. 9-13) identifying a boundary of the stitched circuitry region at which stitching occurs, wherein the boundary identification 200 may take the form of negative space 202 (FIG. 9) in a modified IC chip layout 128 (FIG. 1). When an IC chip layer (FIGS. 10-13) is formed using modified IC chip layout 128 (i.e., reticle 170), it results in an actual boundary identification 201 in an IC chip layer. In one embodiment, negative space 202 includes a void within fill 204 in the circuit design. That is, fill is removed such that a void is formed between stitched circuitry regions when formed. The fill may take the form of, for example, active region fill, polyconductor fill, metal layer fill or metal layer holes. Conventionally, a boundary identification may include a data set delineating x, y coordinate ranges identifying the boundary. However, identification of the boundary in this manner is not easy. In some case, practically no discernable indication is present as to where a pair of stitched circuitry regions meet.

Figure 9:
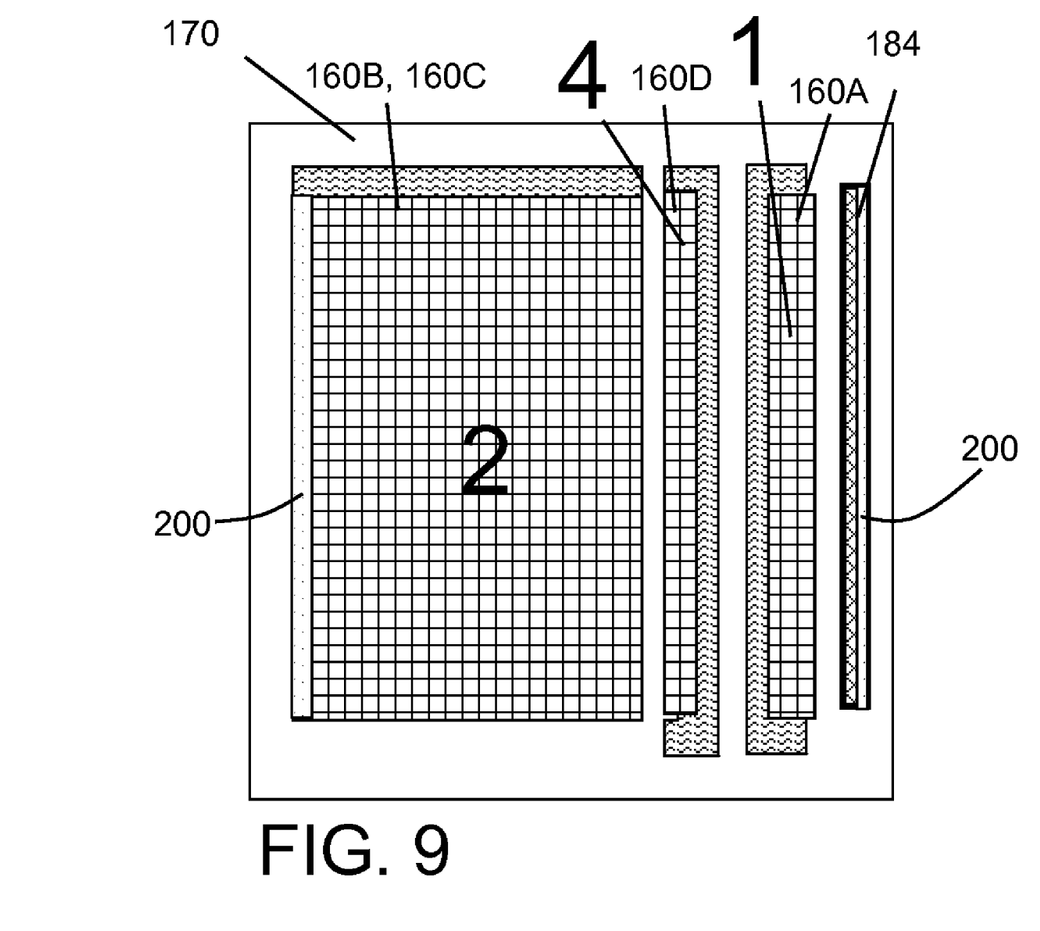
FIGS. 9-13 show embodiments of IC chips formed using a reticle similar to that of FIGS. 7 and 8.
Figure 10:
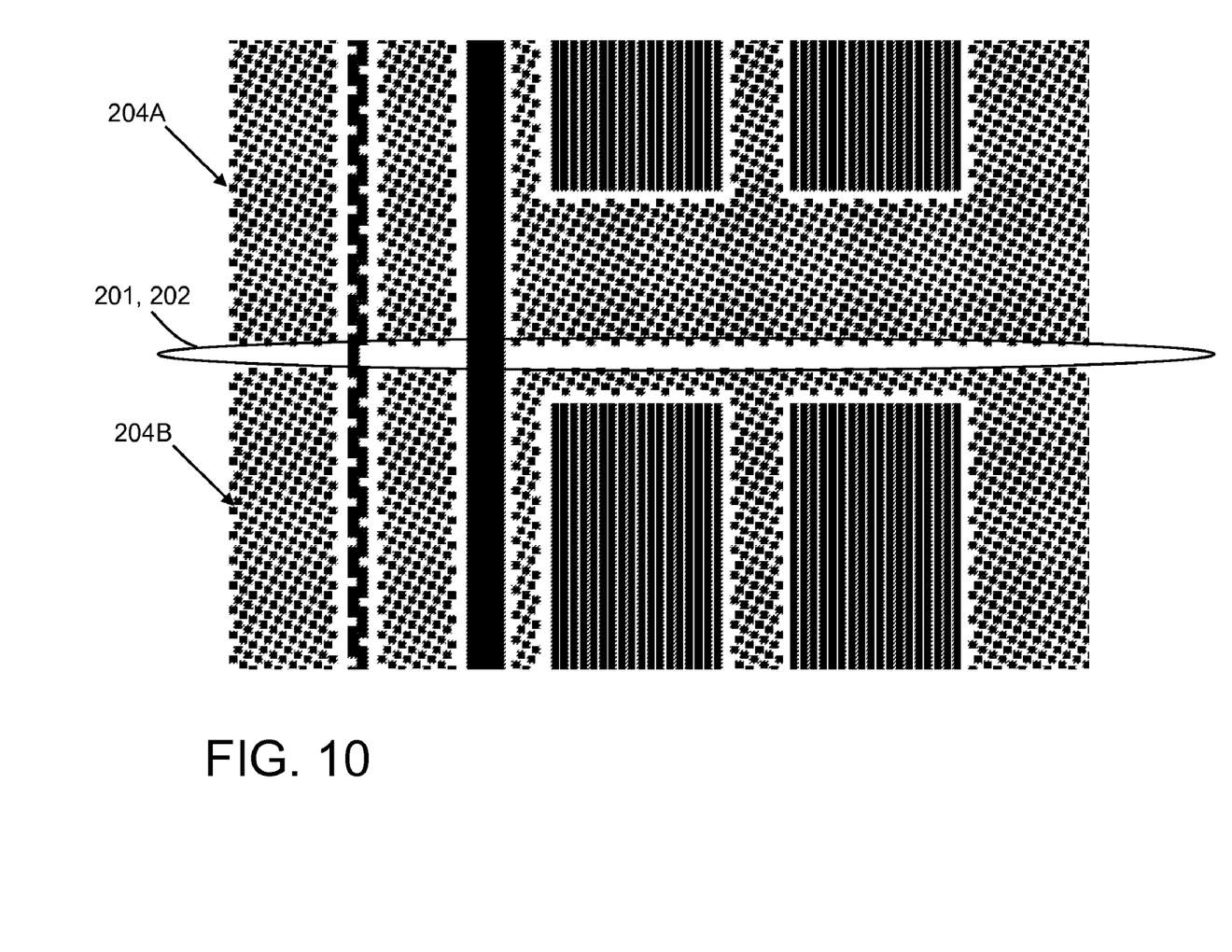
Figure 11:
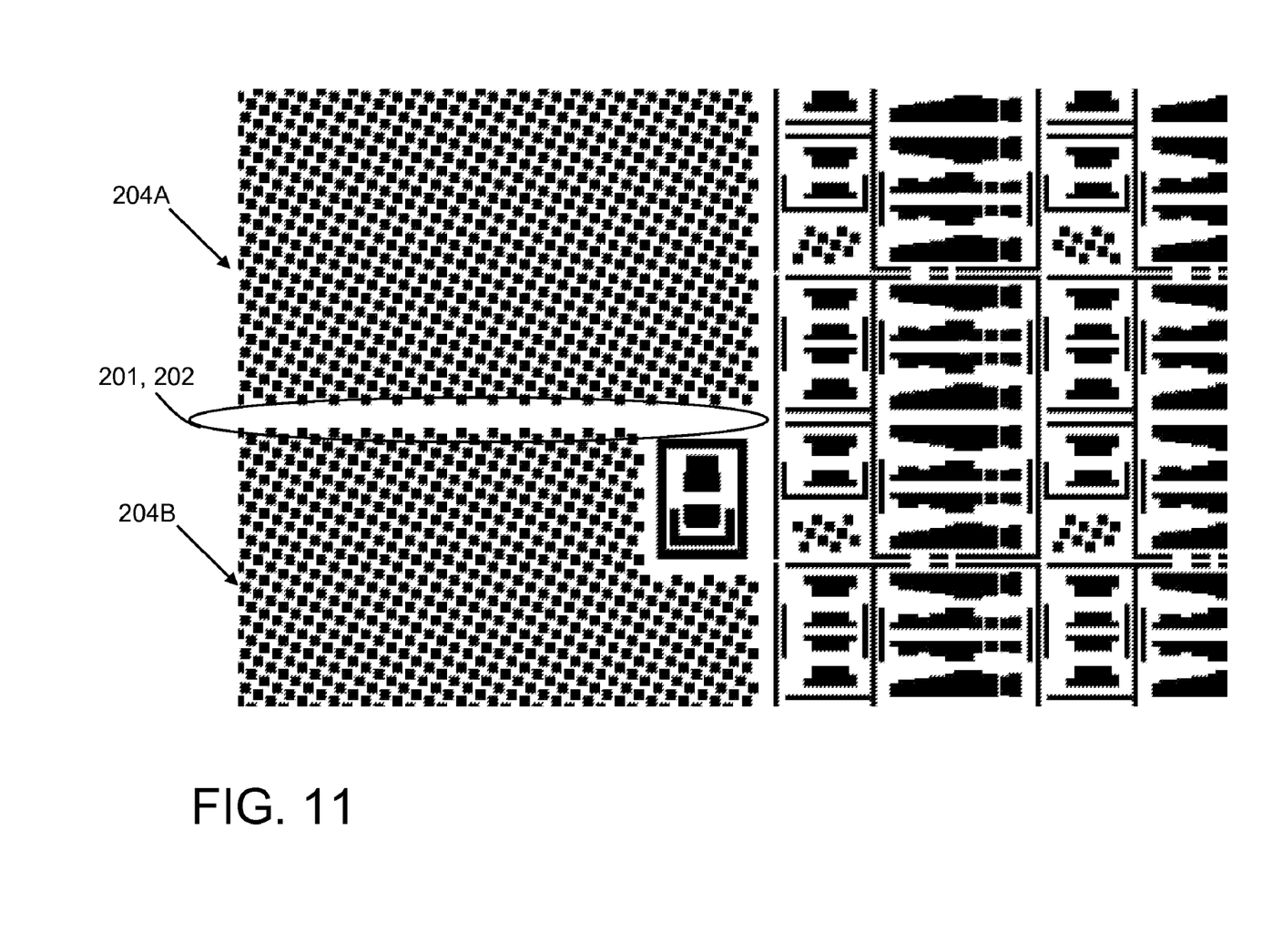
Figure 12:
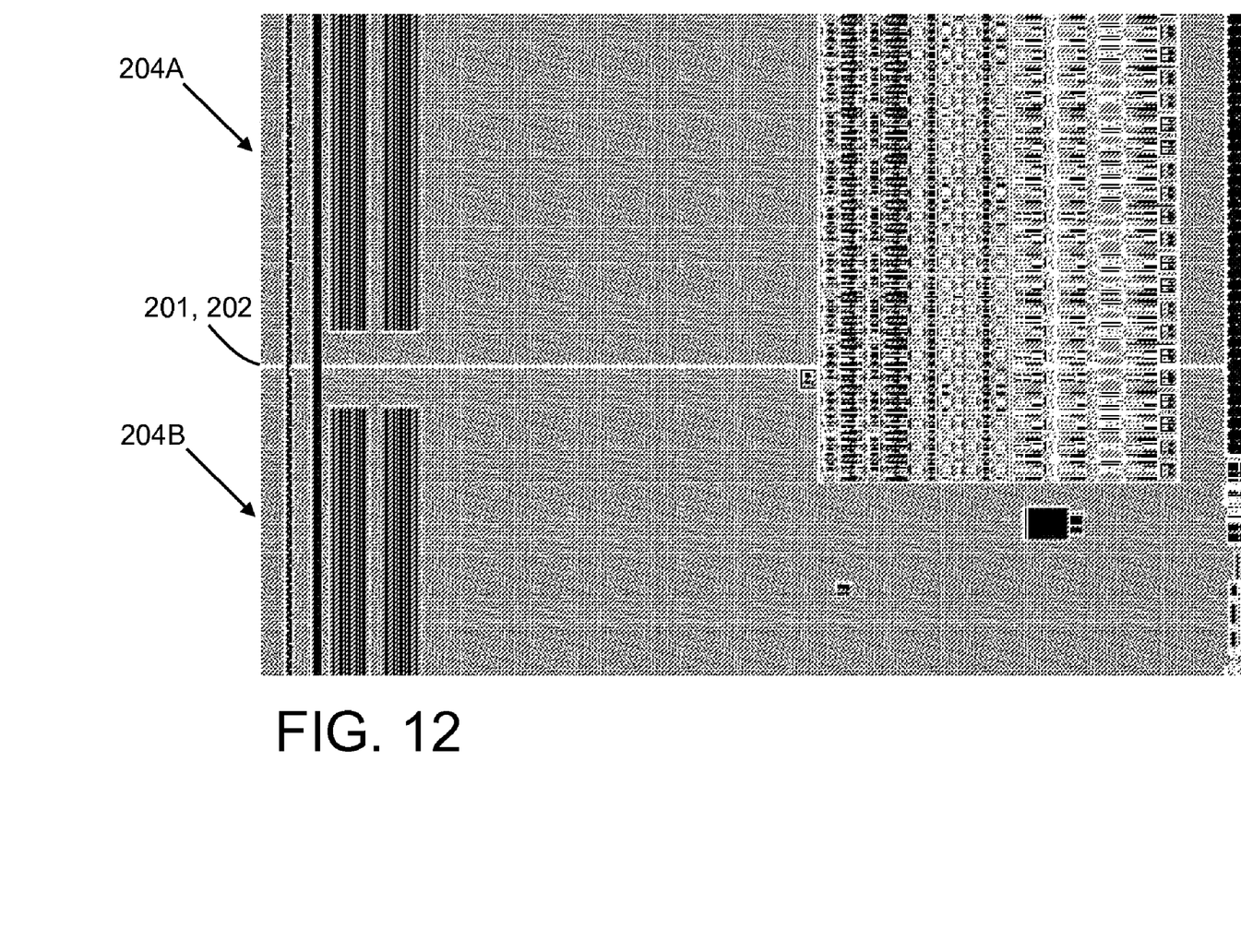
Figure 13:
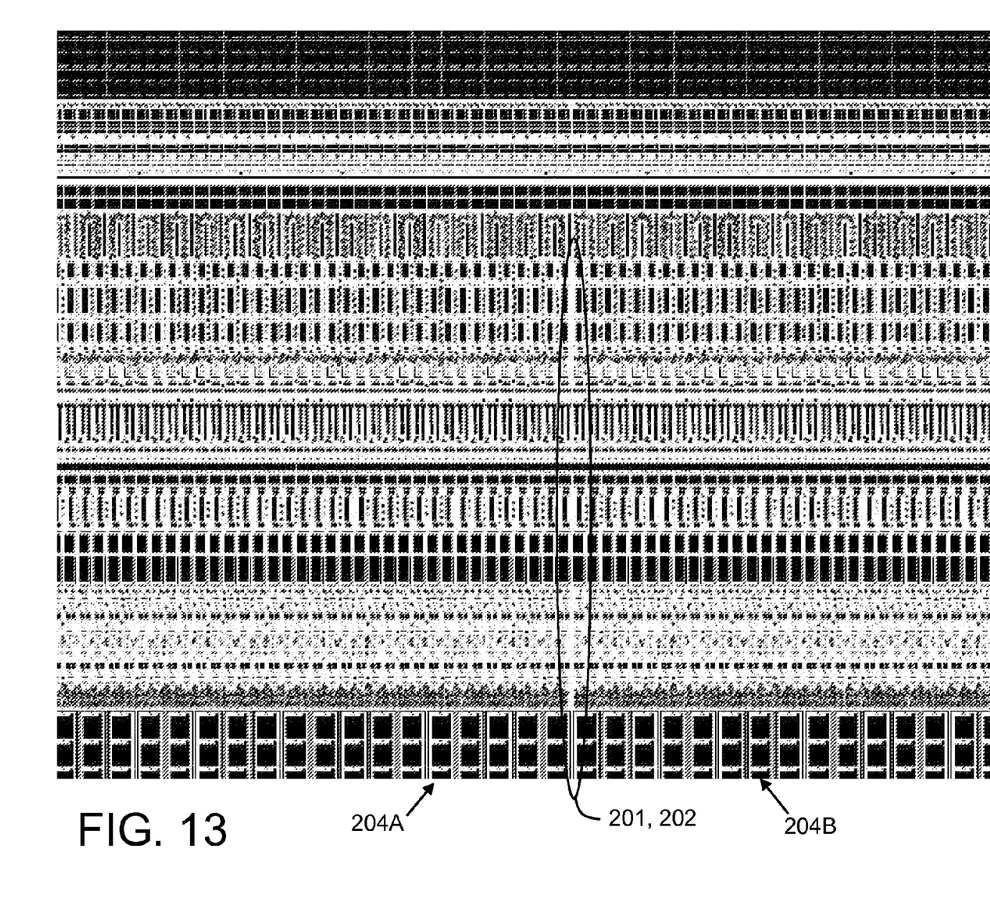

FIG. 9 shows the result of modifier 132 modifying IC chip layout 126 including the placement of boundary identification 200 in reticle 170. In one embodiment, boundary identification 200 is placed in an edge of a stitched circuitry region 160B on reticle 170. Alternatively, where stitched boundary region 184 is employed, boundary identification 200 may be placed in stitched boundary region 184. The amount of fill taken from an edge of a stitched circuitry region 160B to create boundary identification 200 (FIG. 9) in modified IC chip layout 128 may be half that required to adequately created boundary identification 201 (FIGS. 10-13) in an IC chip layer where the mating stitched circuitry region also includes the boundary identification 200 (FIG. 9). FIGS. 10-13 show example IC chip layer images illustrating boundary identification 201 taking the form of negative space 202 after formation of the IC chip layer. In contrast to conventional IC chip layers, negative space 202 makes a boundary between stitched circuit regions 204A, 204B more easily discernable. FIGS. 10-12 show various horizontal boundary identifications 201, and FIG. 13 shows an illustrative vertical boundary identification 201. Note that in each figure, the boundary between stitched circuitry regions 204A, 204B for circuitry outside of the fill regions is practically indiscernible. However, boundary identification 201 in the fill regions is easily recognized. As a result, metrology or other processing that is required to be performed at the boundary of stitched circuitry regions 204A, 204B can be carried out without concern as to whether the area under analysis actually is the boundary.

Returning to FIGS. 1 and 2, in an optional process, process P14, design rule checker (DRC) 134 (FIG. 1) performs design rule checking of now modified IC chip layout 128 to ensure no design rules have been violated by the addition of boundary identification 200 (FIG. 9). DRC 134 may include any now known or later developed design rule checking system.

In another optional process, process P16, stitch boundary checker 136 (FIG. 1) performs stitch boundary checking of modified IC chip layout 128. Stitch boundary checker 136 evaluates modified IC chip layout 128 in a single pass for stitch boundary design conditions and rules (e.g., checks design shapes proximity to stitching boundary, such as design shapes space to stitching boundaries and design shapes overlap past stitching boundaries).

Figure 4:
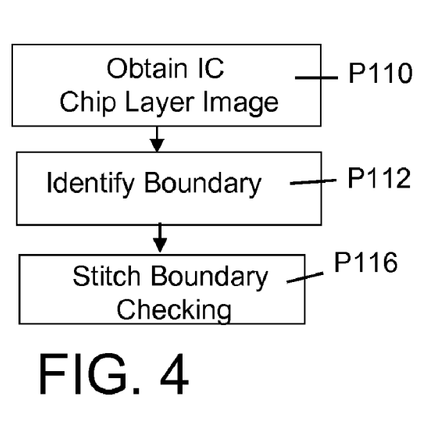
FIG. 4 shows embodiments of a method of identifying a stitched region boundary.

Referring to FIGS. 3-4, details of boundary identifying system 107 (FIG. 3) will now be described. In process P110, IC chip layout obtainer 140 obtains an image of an IC chip layer (FIGS. 10-13) formed using a plurality of stitched circuitry regions 204A-B. IC chip layout obtainer 140 may include any now known or later developed system for obtaining an image of an IC chip layer, e.g., scanning electron microscope, etc., or system to recall previously obtained images of an IC chip layer.

In process P112, boundary identifier 142 (FIG. 3) identifies a boundary between stitched circuitry regions 204A-B by identifying a negative space 202 within the IC chip layer from the image. As noted above, negative space 202 makes a boundary between stitched circuit regions 204A, 204B more easily discernable compared to the boundary between stitched circuitry regions 204A, 204B for circuitry outside of the fill regions. However, boundary identification 201 in the fill regions is easily recognized. As a result, metrology or other processing that is required to be performed at the boundary of stitched circuitry regions 204A, 204B can be carried out without concern as to whether the area under analysis actually is the boundary. Boundary identifier 142 may identify negative space 202 using any now known or later developed technique. In one embodiment, boundary identifier 142 may employ the x,y coordinates of conventional techniques to perform an initial identification and then search for negative space 202. However, that is not necessary.

In an optional process P116, stitch boundary checker 144 (FIG. 3) performs stitch boundary checking of an IC chip layer (FIGS. 10-13). Stitch boundary checker 144 may evaluate IC chip layer (FIGS. 10-13) in a single pass for stitch boundary design conditions and rules (e.g., checks design shapes proximity to stitching boundary, such as design shapes space to stitching boundaries and design shapes overlap past stitching boundaries). The presence of boundary identification 200 in modified IC chip layer makes this process easier since the boundary can be more easily identified.

While the embodiments have been shown and described herein as methods and systems, it is understood that the disclosure further provides various alternative embodiments. That is, the disclosure can take the form of an entirely hardware embodiment, an entirely software embodiment or an embodiment containing both hardware and software elements. In a preferred embodiment, the disclosure is implemented in software, which includes but is not limited to firmware, resident software, microcode, etc. In one embodiment, the disclosure can take the form of a computer program product accessible from a computer-usable or computer-readable medium providing program code for use by or in connection with a computer or any instruction execution system, which when executed, enables a computer infrastructure to the above-described embodiments. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, such as memory 122, magnetic tape, a removable computer diskette, a random access memory (RAM), a read-only memory (ROM), a tape, a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processing unit 114 coupled directly or indirectly to memory elements through a system bus 118. The memory elements can include local memory, e.g., memory 112A or 112B, employed during actual execution of the program code, bulk storage (e.g., memory system 122), and cache memories which provide temporary storage of at least some program code in order to reduce the number of times code must be retrieved from bulk storage during execution.

In another embodiment, the disclosure provides a method of generating a system for aiding in generating a photolithographic reticle and/or modifying a complete integrated circuit (IC) chip layout. In this case, a computer infrastructure, such as computer infrastructure 102 (FIGS. 1 and 3), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing device 104 and/or 105 (FIG. 1 or 3, respectively), from a computer-readable medium; (2) adding one or more computing devices to the computer infrastructure; and (3) incorporating and/or modifying one or more existing systems of the computer infrastructure, to enable the computer infrastructure to perform the process steps of the disclosure.

In still another embodiment, the disclosure provides a business method that performs the process described herein on a subscription, advertising, and/or fee basis. That is, a service provider, such as a foundry, could offer to aid in generating a photolithographic reticle and/or modify a complete integrated circuit (IC) chip layout as described herein. In this case, the service provider can manage (e.g., create, maintain, support, etc.) a computer infrastructure, such as computer infrastructure 102 (FIG. 1) or parts thereof, that performs the processes described herein for one or more customers. In return, the service provider can receive payment from the customer(s) under a subscription and/or fee agreement, receive payment from the sale of advertising to one or more third parties, and/or the like.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like. Further, it is understood that the terms "component" and "system" are synonymous as used herein and represent any combination of hardware and/or software capable of performing some function(s).

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

Referring back to FIGS. 10-13, each figure illustrates an IC chip including a plurality of stitched circuitry regions 204A-B, and a boundary identification 201 identifying a boundary between a pair of the stitched circuitry regions 204A-B. As indicated above, boundary identification 201 takes the form of negative space 202 in a layer of the IC chip.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 14:
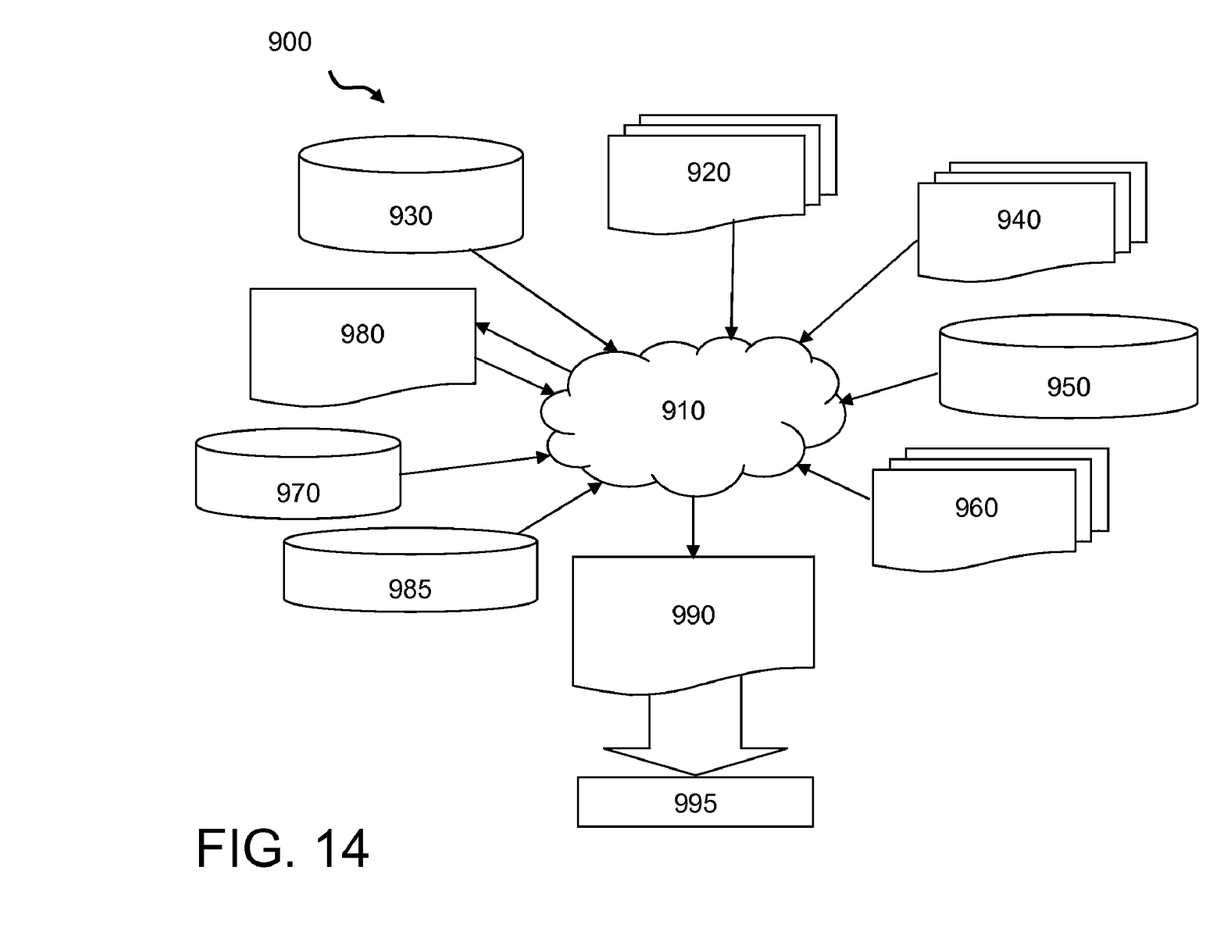
FIG. 14 shows a flow diagram of a design process used in semiconductor design, manufacture, and/or test.

Referring to FIG. 14, a block diagram of an exemplary design flow 900 used for example, in semiconductor design, manufacturing, and/or test, is shown. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the disclosure as shown in FIGS. 9-13 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the disclosure as shown in FIGS. 9-13. Design process 910 preferably synthesizes (or translates) an embodiment of the disclosure as shown in FIGS. 9-13 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the disclosure. The design structure of the disclosure is not limited to any specific design flow. Design process 910 preferably translates an embodiment of the disclosure as shown in FIGS. 9-13, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the disclosure as shown in FIGS. 9-13. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method performed using at least one computing device, the method comprising:
    obtaining an image of an integrated circuit (IC) chip layer formed using a plurality of stitched circuitry regions, using the at least one computing device; and
    identifying a boundary between a pair of the stitched circuitry regions by identifying a negative space in the image of the IC chip layer.

2. The method of claim 1, wherein the negative space includes a void within a fill in the image of the IC chip layer.

3. The method of claim 2, wherein the fill is selected from the group consisting of: active region fill, polyconductor fill, metal layer fill and metal layer holes.

4. The method of claim 1, further comprising performing stitch boundary checking.

5. An integrated circuit (IC) chip comprising:
    a plurality of stitched circuitry regions; and
    a boundary identification identifying a boundary between a pair of the stitched circuitry regions,
    wherein the boundary identification takes a form of a negative space in a layer of the IC chip.

6. The IC chip of claim 5, wherein the negative space includes a void within a fill in the layer of the IC chip.

7. The IC chip of claim 6, wherein the fill is selected from the group consisting of: active region fill, polyconductor fill, metal layer fill and metal layer holes.

8. A design structure embodied in a non-transitory computer readable medium for causing one or more computing devices to design, manufacture or test an integrated circuit, the design structure comprising:

an integrated circuit (IC) chip including:
- a plurality of stitched circuitry regions; and
- a boundary identification identifying a boundary between a pair of the stitched circuitry regions, wherein the boundary identification takes a form of a negative space in a layer of the IC chip.

9. The design structure of claim 8, wherein the negative space includes a void within a fill in the layer of the IC chip.

10. The design structure of claim 9, wherein the fill is selected from the group consisting of: active region fill, polyconductor fill, metal layer fill and metal layer holes.

11. The design structure of claim 8, wherein the design structure comprises a netlist.

12. The design structure of claim 8, wherein the design structure resides on storage medium as a data format used for an exchange of layout data of integrated circuits.

13. The design structure of claim 8, wherein the design structure includes at least one of test data, characterization data, verification data, or design specifications.

* * * * *